(12) United States Patent  
Mehraeen et al.

(10) Patent No.: US 8,129,887 B2  
(45) Date of Patent: Mar. 6, 2012

(54) SYSTEM AND METHOD FOR HARVESTING ENERGY FROM ENVIRONMENTAL VIBRATIONS

(75) Inventors: Shahab Mehraeen, Rolla, MO (US); Jagannathan Sarangapani, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 562 days.

(21) Appl. No.: 12/363,082

(22) Filed: Jan. 30, 2009

(65) Prior Publication Data

US 2010/0194239 A1 Aug. 5, 2010

(51) Int. Cl.
*H01L 41/08* (2006.01)
(52) U.S. Cl. .......................... 310/339; 310/319; 310/330
(58) Field of Classification Search .................. 310/330, 310/339, 319, 311, 331–332; *H01I 41/09, H01I 41/08*
See application file for complete search history.

(56) References Cited

U.S. PATENT DOCUMENTS

| 7,397,169 B2 * | 7/2008 | Nersessian et al. ........... 310/339 |
| 7,692,365 B2 * | 4/2010 | Churchill et al. ............. 310/339 |
| 2007/0284969 A1 * | 12/2007 | Xu ................................ 310/339 |

OTHER PUBLICATIONS

S. W. Arms, C. P. Townsend, D. L. Churchill, J. H. Galbreath, and S. W. Mundell, Power management for energy harvesting wireless sensors, Proc. SPIE 5763, 267 (2005), DOI:10.1117/12.600302.

Roundy S, Leland E S, Baker J, Carleton E, Reilly E, Lai E, Otis B, Rabaey J M, Wright P K and Sundararajan V 2005 Improving power output for vibration-based energy scavengers IEEE Pervasive Comput. 4 28-36.

Guyomar Daniel; Badel Adrien; Lefeuvre Elie; Richard Claude Toward energy harvesting using active materials and conversion improvement by nonlinear processing. IEEE transactions on ultrasonics, ferroelectrics, and frequency control 2005;52(4):584-595.

Badel A, Benayad A, Lefeuvre E, Lebrun L, Richard C and Guyomar D 2006 Single crystals and nonlinear process for outstanding vibration-powered electrical generators IEEE Trans. Ultrason. Ferroelectr. Freq. Control 53 673-684.

Ottman G K, Hofmann H F and Lesieutre G A 2003 Optimized piezoelectric energy harvesting circuit using step-down converter in discontinuous conduction mode, IEEE Trans. Power Electron. vol. 18 696-703.

Erick O. Torres, Gaberial A. Rincon-Mora, "Energy Harvesting Chips and Quest for Everlasting Life", Power Management Design, Jun. 2005.

Despesse G, Jager T, Chaillout J, Leger J, Basrour S, "Design and Fabrication of a New System for Vibration Energy Harvesting", Proc. of IEEE Ultrasonic Symposium, pp. 946-949, 2005.

(Continued)

*Primary Examiner* — Thomas Dougherty
*Assistant Examiner* — Karen B Addison
(74) *Attorney, Agent, or Firm* — Hovey Williams LLP

(57) ABSTRACT

Embodiments of the present invention provide a system and a method for increasing the harvested energy from a piezoelectric element exposed to environmental vibrations via a two-prong system. In a first prong, a cantilever beam is tapered and shaped so as to increase and provide an approximately uniform strain on and along the beam, thus resulting in increased voltage. In a second prong of the system and method, a voltage compensating circuit, when used with a voltage inversion circuit of the prior art, increases the harvested power by injecting current to the piezoelectric element after each voltage inversion so as to increase the voltage level.

14 Claims, 15 Drawing Sheets

*Flexture Beam   Piezoelectric Material*

OTHER PUBLICATIONS

Vujay Raghunathan, Aman Kansal, Jason Hsu, Jonathan Friedman, and Mani Srivastava, "Design Considerations for Solar Energy Harvesting Wireless Embedded Systems", Proc. of the IEEE, pp. 457-462, 2005.

Thomas J. Johnson and W. Clark, "Works in Progress", Energy Harvesting Projects Pervasive Computing, IEEE, pp. 70-71, 2005.

Roundy S, Wirght P.K. "A Piezoelectroic Vibration based Generator for Wireless Electronics," Smart Materials and Structures, vol. 13, pp. 1131-1142, 2004.

D.L. Churchill, M.J. Hamel, C.P. Townsend, S.W. Arms, MicroStrin Inc. Power Point, 2003.

\* cited by examiner

Schematic for a Piezoelectric Circuit

Schematic for a Piezoelectric Parallel Voltage Inversion Circuit

Schematic for a Piezoelectric Series Voltage Inversion Circuit

Schematic for a Piezoelectric Parallel Voltage Compensating Circuit

Comparison of Voltage Waveforms for the Prior Art Parallel Voltage Inversion Circuit vs. the Voltage Compensating Circuit of Embodiments of the Present Invention Schematic for a Piezoelectric Series Voltage Compensating Circuit Comparison of Voltage Waveforms for the Prior Art Series Voltage Inversion Circuit vs. the Voltage Compensating Circuit of Embodiments of the Present Invention Experimental Test Circuitry Prior Art Rectangular-Shaped Cantilever Beam Comparison of the Voltage Inversion Circuit of the Prior Art vs.
the Parallel Voltage Compensating Circuit of Embodiments of the Present Invention with the
Parallel Voltage Inversion Circuit and Using a Prior Art Rectangular-Shaped Cantilever Beam Comparison of the Series Voltage Inversion Circuit of the Prior Art vs.
Both a One-Step and a Two-Step Series Voltage Compensating Circuit of
Embodiments of the Present Invention with the Series Voltage Inversion Circuit and Using a
Prior Art Rectangular-Shaped Cantilever Beam Comparison of the Voltage Inversion Circuit of the Prior Art vs.
the Parallel Voltage Compensating Circuit of Embodiments of the Present Invention with the
Parallel Voltage Inversion Circuit and Using a Tapered Cantilever Beam
of Embodiments of the Present Invention Comparison of the Series Voltage Inversion Circuit of the Prior Art vs.
a Two-Step Series Voltage Compensating Circuit of
Embodiments of the Present Invention with the Series Voltage Inversion Circuit and Using a
Tapered Cantilever Beam of Embodiments of the Present Invention Power Evaluation from a Bulldozer Using the Energy Harvesting System of Embodiments of the Present Invention

SYSTEM AND METHOD FOR HARVESTING ENERGY FROM ENVIRONMENTAL VIBRATIONS

FEDERALLY SPONSORED RESEARCH/DEVELOPMENT PROGRAM

This invention was made with government support under contract number IIP-0639182 awarded by the National Science Foundation. The United States government has certain rights in the invention.

BACKGROUND

1. Field

The present invention relates to a system and method for harvesting energy from environmental vibrations. More particularly, embodiments of the present invention relate to a system and method for harvesting energy by applying mechanical strain to a specially-shaped piezoelectric element and harvesting the resulting output power using a combination of a voltage inversion circuit, a voltage compensating circuit, and the specially-shape piezoelectric element.

2. Description of the Related Art

Wireless sensors and other portable electronic devices are becoming ubiquitous. Batteries are commonly used to power these devices, but due to the batteries' low durability, they must be replaced periodically. This procedure is costly, especially for devices that are associated with remote structures. Examples of such devices include health monitoring of earth-moving equipment and bridges where continuous data gathering is essential. Accordingly, there is a need for a more durable source of energy beyond batteries.

A source of energy previously studied and applied is energy harvesting from environmental or ambient sources. The conversion of ambient energy into usable electrical form is often referred to as energy harvesting or scavenging. Scavenged energy can be obtained from, for example, solar, thermal, pyroelectric, and piezoelectric sources. Depending on the type of source of ambient energy, the scavenged energy might be quite large. However, in the case of piezoelectric sources, the scavenged energy is often quite small, and thus, the harvested or scavenged energy is only useful either as a supplement to an existing energy source, such as a battery, or to power small electronic devices. Harvested energy from piezoelectric sources can also be used to extend the lifetime of installed batteries and/or reduce the needed size of batteries, which is an important consideration for mobile devices.

Prior art techniques of harvesting energy from piezoelectric sources have relied on small, cantilever beams using a piezoelectric element that can scavenge power from low-level ambient vibration sources. The cantilever beams are designed to resonate as close as possible to the frequency of the driving surface on which they are mounted. An average power consumption of 120 microwatts is common. Prior art scavenging techniques have mainly focused on finding an efficient mechanical structure to transfer maximum possible strain to the piezoelectric element.

One possible design for transferring mechanical strain to a piezoelectric element is based on coupling the piezoelectric element to a two-layer bender (or bimorph) mounted as a cantilever beam. The bender's top and bottom layers are directly coupled with or comprised of the piezoelectric material. By choosing an appropriate thickness of the piezoelectric material, an inner layer of the beam improves overall electromechanical coupling. Additionally, the shape of the beam itself, and consequently, the shape of the piezoelectric material coupled to the beam, affects the possible power output. This is because some shapes are more efficient at exploiting the mechanical strain on the beam than other shapes.

Accordingly, there is a need for a cantilever beam design that (a) maximizes the piezoelectric response for a given input; (b) improves scavenger robustness by reducing stress concentration on the beam; and (c) minimizes power loss (damping) associated with the beam's shape or design.

Prior art systems and methods for increasing the energy harvested also use circuitry to boost the power. One common prior art circuit for boosting power from a piezoelectric element is a voltage inversion circuit, commonly referred to as synchronized switch harvesting on inductor ("SSHI"). The voltage inversion circuit injects current into a clamping capacitor of the piezoelectric element. Different voltage inversion techniques have been proposed to shape the voltage waveform in order to increase the voltage and power factor from the piezoelectric element, which consequently increases the harvested power. The shaped voltage waveform in prior art voltage inversion techniques increases the harvested power noticeably; however, the optimal voltage waveform is usually not obtained. Accordingly, a system and method for shaping and achieving the optimal voltage waveform in piezoelectric power harvesting is needed.

SUMMARY

The present invention solves the above-described problems and provides a distinct advance in the art of harvesting energy from environmental vibrations. More particularly, the present invention provides a system and a method for increasing the harvested energy from a piezoelectric element exposed to environmental vibrations via a two-prong system.

In a first prong of the system and method of embodiments of the present invention, a cantilever beam is shaped so as to increase and provide an approximately uniform strain on and along the beam, thus resulting in increased voltage. The cantilever beam of embodiments of the present invention is tapered and includes a body having a fixed end configured to be coupled with a vibrating member, a narrowed end narrower than the fixed end and opposite the fixed end, a first tapered surface, and a second tapered surface.

The tapered cantilever beam of embodiments of the present invention has the advantage of a more uniform distribution of strain across the piezoelectric element coupled to the beam than prior art beam shapes, such as rectangular or trapezoidal. Applicants' simulations show that the tapered beam of embodiments of the present invention has a nearly constant strain profile and is able to produce almost twice as much average strain on the beam as compared to the rectangular-shaped beam of the prior art.

In a second prong of the system and method of embodiments of the present invention, a voltage compensating circuit, when used with a voltage inversion circuit of the prior art, increases the harvested power by injecting current to the piezoelectric element after each voltage inversion so as to increase the voltage level. The voltage compensating circuit is, in embodiments of the present invention, at least a two-step circuit comprising a first step of synchronizing at least one voltage compensating switch with at least one voltage inverting switch by applying an adequate delay to end the voltage inversion and establish a new voltage in the original voltage inversion circuit, and a second step of consecutively closing the at least one voltage compensating switch to allow a transfer of energy, i.e., injection of current, to the piezoelectric element.

Application of the voltage compensating circuit of embodiments of the present invention, when used with a prior art rectangular-shaped cantilever beam, provides an approximately 15% increase in the harvested power in a parallel voltage inversion and an approximately 50% increase in a series voltage inversion. Application of the voltage compensating circuit along with the tapered cantilever beam of embodiments of the present invention results in an additional approximately 15% increase in the harvested power in the parallel voltage inversion and an approximately 75% increase in the series voltage inversion.

These and other important aspects of the present invention are described more fully in the detailed description below.

BRIEF DESCRIPTION OF THE DRAWING FIGURES

Embodiments of the present invention are described in detail below with reference to the attached drawing figures, wherein.

Figure 16:
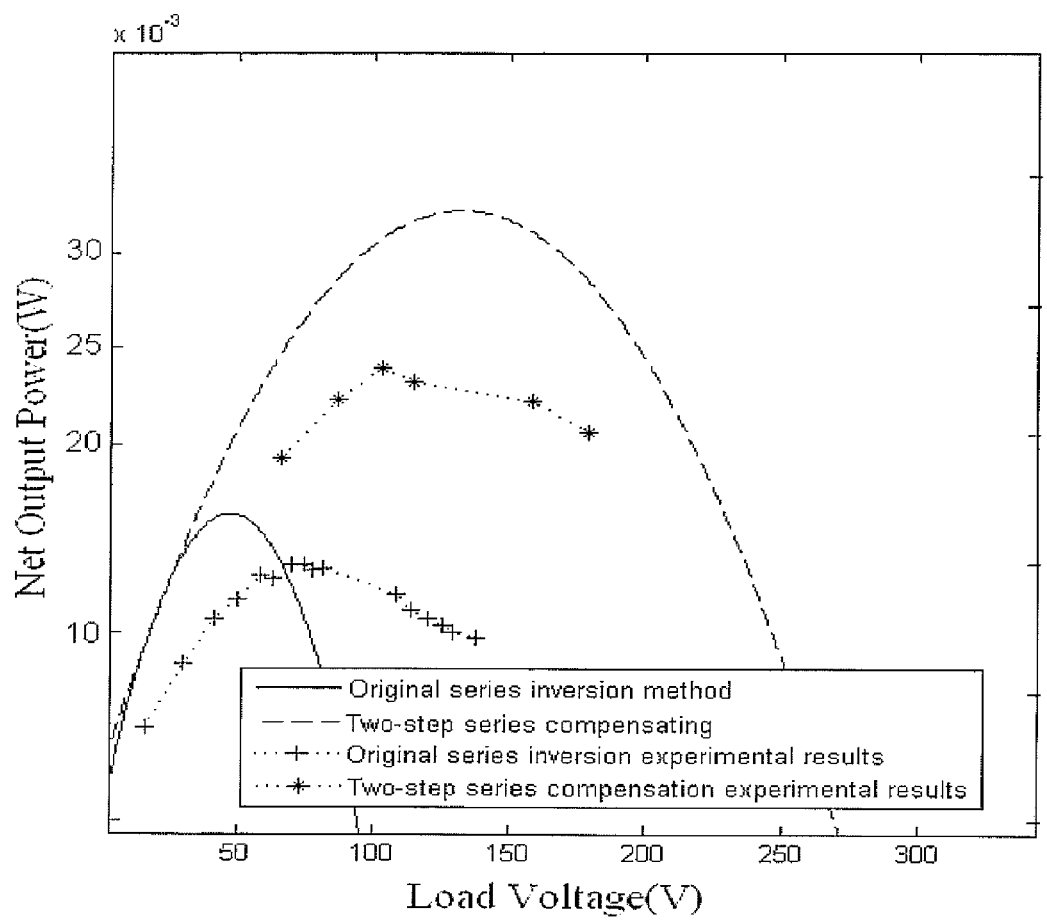
Figure 17:
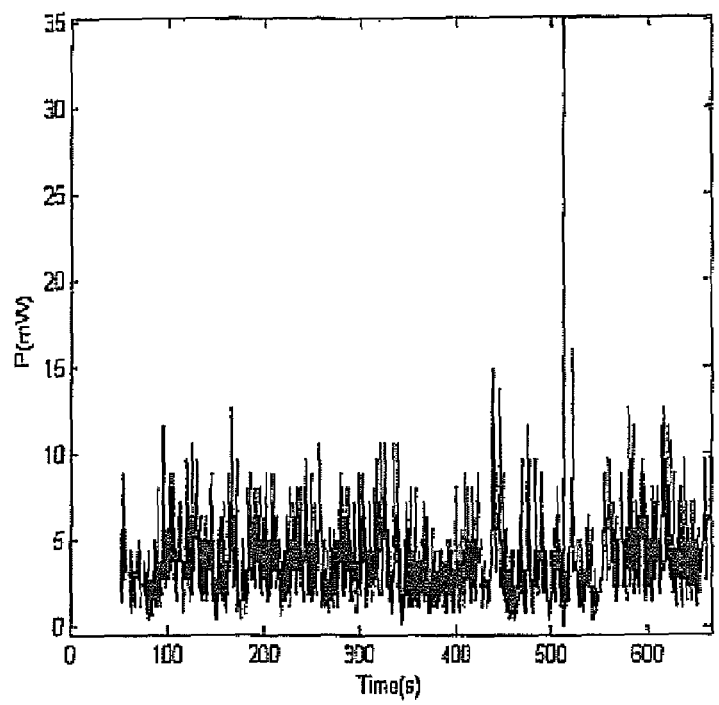

FIG. 16 is a graph comparing the series voltage inversion circuit of the prior art when used alone versus when used with both a one-step and a two-step series voltage compensating circuit of embodiments of the present invention when using the tapered cantilever beam of embodiments of the present invention and further illustrating both theoretical and experimental results; and FIG. 17 is a graph of time versus power from Applicants' field experiments of a bulldozer equipped with the energy harvesting system of embodiments of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

Figure 1:
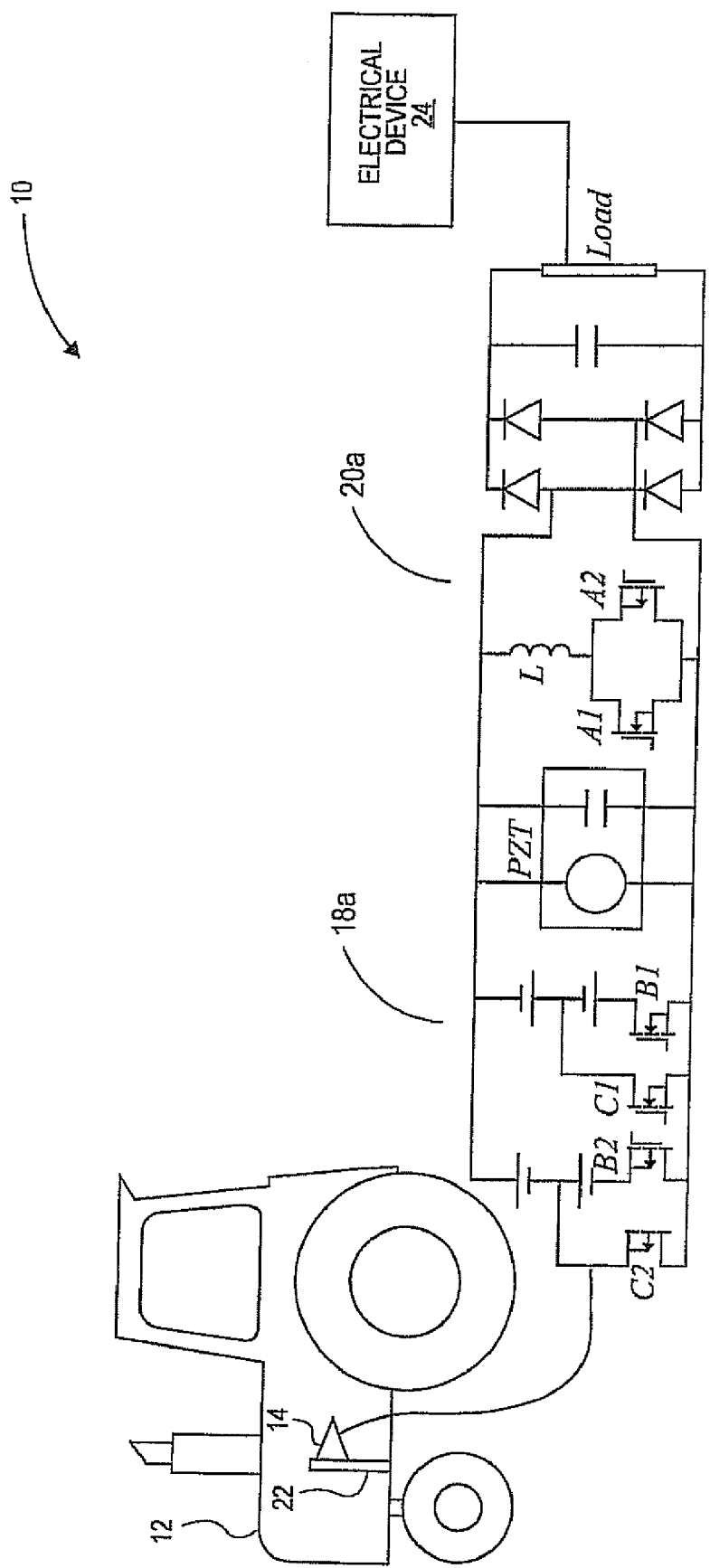
FIG. 1 is a block diagram of an embodiment of the system of the present invention.

Turning now to the drawing figures, and particularly FIG. 1, a system 10 and method in accordance with embodiments of the present invention is depicted. The system and method are operable to increase an amount of energy harvested or otherwise scavenged from vibrations occurring in the environment, such as vibrations occurring from heavy, earthmoving machinery. Although energy harvesting from the vibrations of large machinery will be discussed herein, it is understood that embodiments of the present invention could be used with any ambient vibrations, regardless of whether resulting from heavy machinery.

The system of embodiments of the present invention comprises a vibration-producing device 12 operable to produce vibrations; a tapered cantilever beam 14 associated with the vibration-producing device 12 and configured to receive the vibrations; a piezoelectric element 16 coupled with the cantilever beam 14 and operable to receive a strain from the vibrations so as to induce a voltage across the element 16; a voltage inversion circuit 18 coupled with the piezoelectric element 16 and operable to invert the voltage so as to boost a power output; and a voltage compensating circuit 20 operable to further increase the power output by injecting current to the piezoelectric element 16 after each voltage inversion performed by the voltage inversion circuit 18. Applicants have found that application of the voltage compensating circuit 20 increases harvested power by approximately 15%, and use of the tapered cantilever boom 14 produces approximately twice as much strain and more than three times as much power as prior art beam shapes, as discussed in more detail below.

The vibration-producing device 12 of embodiments of the present invention is any device that produces relatively frequent vibrations, such as, for example, large machinery. The cantilever beam 14 is associated with the vibration-producing device 12, and in embodiments of the present invention, extends horizontally from a vibrating vertical member 22 coupled to, housed within, or otherwise associated with the vibration-producing device 12. Alternatively, the cantilever beam is coupled directly to the device. As can be appreciated, the vibration-producing device 12 is likely comprised of numerous components, and therefore, any location where the cantilever beam 14 can be properly mounted so as to be vibrated is sufficient for embodiments of the present invention.

The vibrating vertical member 22 is coupled with the vibration-producing device 12 such that the vertical member 22 receives vibrations from the vibration-producing device 12 and consequently vibrates in response to the vibrations. The cantilever beam 14 coupled with the vibrating vertical member 22 then consequently vibrates. As noted above, the piezoelectric element 16 is coupled with the cantilever beam 14 and operable to produce a voltage when subjected to the vibrations, as is well known in the art.

The cantilever beam 14 of embodiments of the present invention is preferably flexible and is at least partially covered with the piezoelectric element 16, which comprises thin, flexible strips of composite fibers (not shown) with laminate coating that are adhesively coupled with the beam 14. The cantilever beam includes a body 15 having a fixed end 17 configured to be coupled with the vibrating vertical member 22, a narrowed end 19 narrower than the fixed end 17 and opposite the fixed end 17, a first tapered surface 21, and a second tapered surface 23. The body 15 of the beam 14 may be a single piece or may be comprised of first and second tapered pieces.

As is known in the art, a strain is applied to the piezoelectric element 16 due to the vibration of the cantilever beam 14. The strain on the piezoelectric element 16 induces a voltage across the element 16. Thus, the energy resulting from vibration of the vibration-producing device 12 is transferred to the piezoelectric element 16, which is operable to induce a voltage that can then be converted to an output power operable to power an electrical device 24, such as a small sensor or MEMS.

As can be appreciated, the thin, flexible strips of piezoelectric element 16 are, in embodiments of the present invention, so closely coupled with the cantilever beam 14 that the piezoelectric element 16 essentially takes the shape of the beam 14. Therefore, reference to a specially-shaped piezoelectric element 16 herein is to be understood as reference to the shape of the element 16 due to the shape of the cantilever beam 14.

Figure 2:
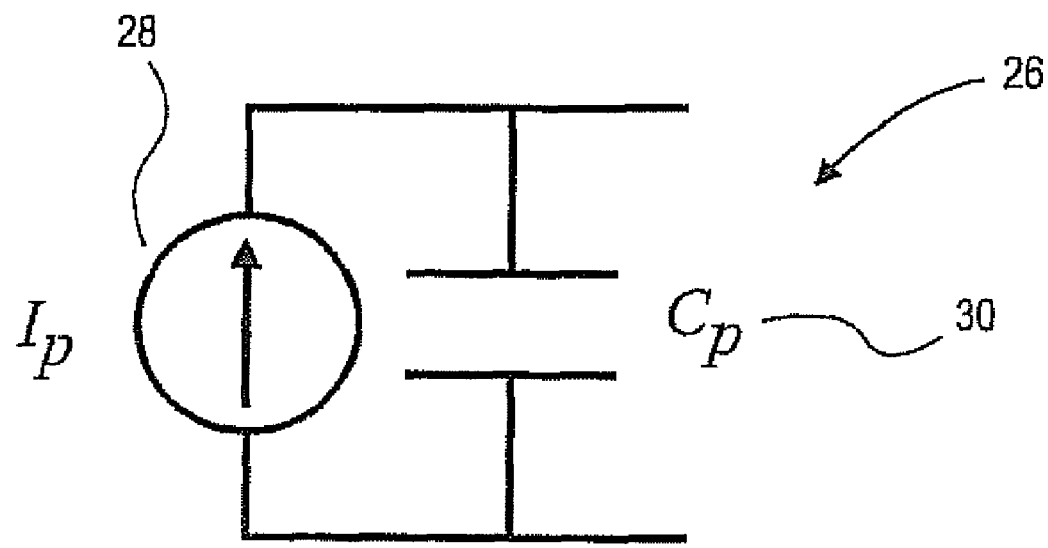
FIG. 2 is a schematic for an exemplary electrical circuit of a piezoelectric element of embodiments of the present invention.

The strain and vibration applied to the piezoelectric element 16 are determined below, with reference to FIG. 2, which illustrates a simple electrical circuit 26 for the piezoelectric element 16. As can be appreciated, the piezoelectric element 16 comprises a current source $I_p$ 28 in parallel with a capacitor 30, also referred to as a piezoelectric clamping capacitor, $C_p$. In particular, the mechanical strain along the piezoelectric element 16 is determined by $\delta = \sigma/Y + dE$ and $D = \in E + d\sigma$, where $\delta$ is the mechanical strain, $\sigma$ is the mechanical stress, Y is the piezoelectric element's Young's modulus, d is the piezoelectric strain coefficient, E is the electrical field, D is the charge density, and $\in$ is the dielectric constant of the piezoelectric element 16. Under sinusoidal vibration, the equation for D can be transformed into a more convenient form as $I = i_p - C_p \dot{V}$, where I is the output current, $i_p = I_p \sin(\omega t)$ is the piezoelectric polarization current with peak value given by $I_p$, $\omega$ is the frequency, $C_p$ is the PZT capacitance, and V is the piezoelectric terminal voltage.

As the cantilever beam 14 vibrates and consequently applies stress to the piezoelectric element 16, the current source 28 provides current to the element 16 that is proportional to the magnitude of the vibration and frequency of the element 16. Because the current is controlled by the vibration and the shape of the cantilever beam 14, the system 10 does not have control over the current. Therefore, to increase the power from the piezoelectric element 16, the voltage across the element 16, i.e., the current source 28 and the clamping capacitor 30, is increased using the voltage inversion circuit 18, as described in more detail below.

Figure 3A:
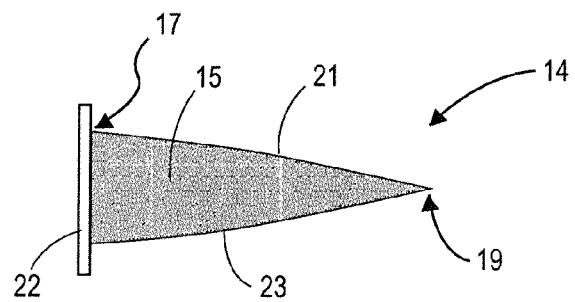
FIG. 3A is a vertical cross-section of a tapered cantilever beam of embodiments of the present invention.
Figure 4:
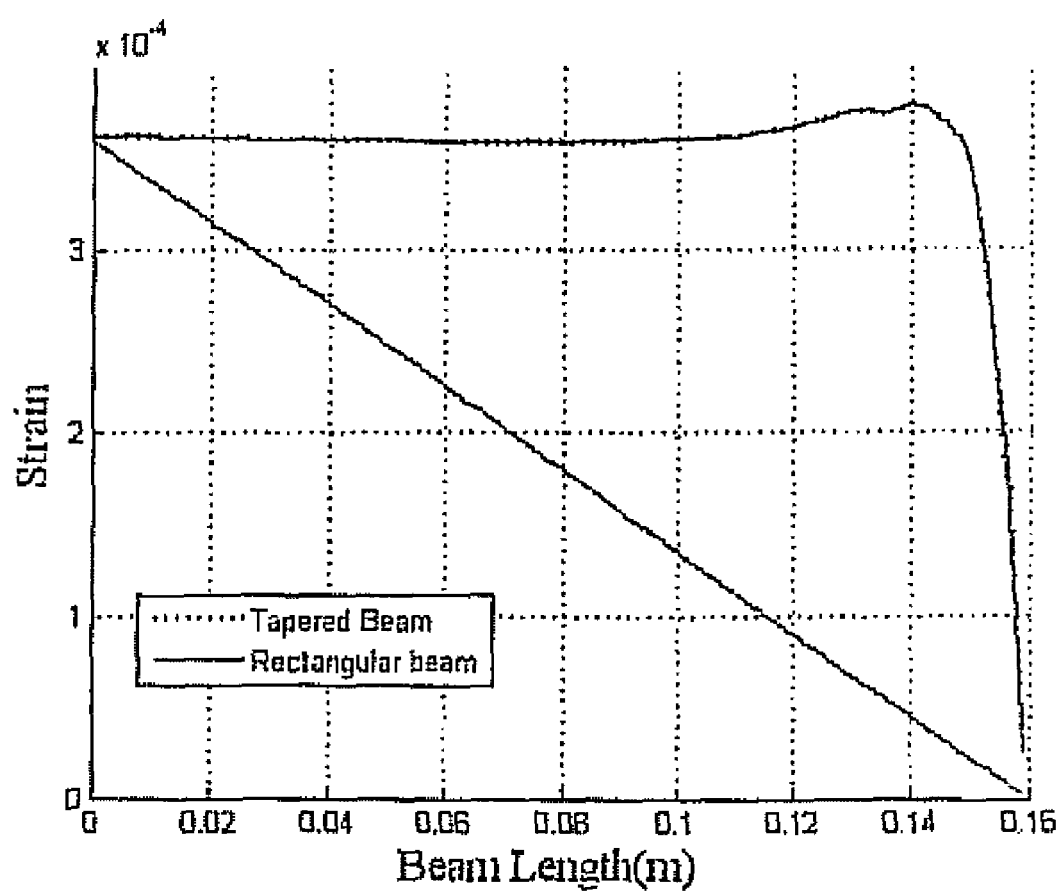
FIG. 4 is a graph illustrating a length of the beam versus average strain for both the tapered beam of embodiments of the present invention and a rectangular-shaped beam of the prior art.

Embodiments of the present invention increase the harvested power using either or both of a two-prong approach. In a first prong, the cantilever beam 14 is shaped to increase and provide an approximately uniform strain on and along the beam 14, thus resulting in increased voltage. In particular, the cantilever beam 14 of embodiments of the present invention is tapered, as best illustrated in FIG. 3A. Applicants have found that the tapered beam 14 has the advantage of a more uniform distribution of strain across the piezoelectric element 16 coupled to the beam 14 than prior art beam shapes, such as rectangular or trapezoidal. Applicants' simulations show that the tapered beam 14 of embodiments of the present invention has a nearly constant strain profile and is able to produce almost twice as much average strain on the beam as compared to the rectangular-shaped beam of the prior art. A graph of the produced strain in view of the beam length is illustrated in FIG. 4.

Figure 3B:
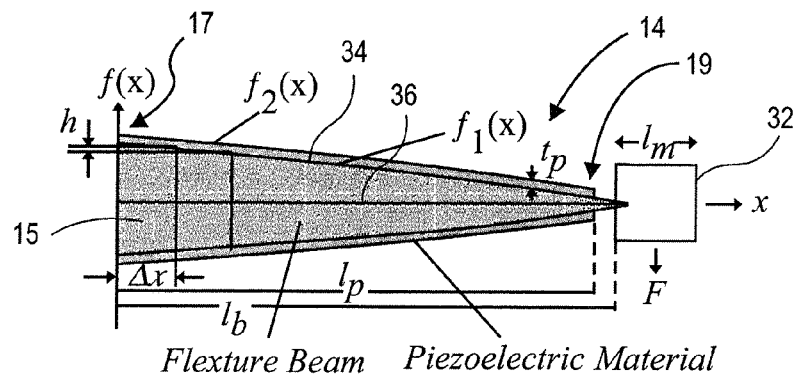
FIG. 3B is a vertical cross-section of the tapered cantilever beam and further illustrating a proof mass secured to a flexing end of the beam and the beam broken into mathematical segments for reference to the Equations set forth herein.
Figure 3C:
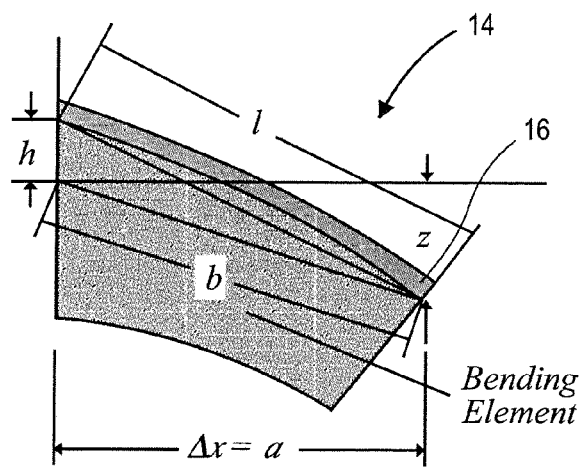
FIG. 3C is a vertical cross-section of a segment of the tapered cantilever beam and further illustrating a bending element of the beam.

The strain on the cantilever beam 14 can be calculated using the following mathematical analysis, with additional reference to FIG. 3B, which illustrates the cantilever beam 14 in view of the below-discussed mathematical analysis, and FIG. 3C, which illustrates an enlarged picture of the beam's bending element. A proof mass 32 coupled to a narrowed end of the beam 14 is also illustrated in FIG. 3B. Referring to FIG. 3B, the function $f_1(x)$ describes the distance between the cantilever beam's surface 34 and beam center 36. The function $f_2(x) = f_1(x) + t_b/2$, where $t_b$ is the piezoelectric element's thickness. Applying basic geometry, $$l^2 = (z+h)^2 + a^2 = b^2 + h^2 + 2zh \tag{1}$$

According to the Moment-Area Method, $$z = \frac{M(x)}{EI(x)} * \frac{\Delta x^2}{2} \tag{2}$$

where $$M(x) = \frac{F}{EI(x)}\left(l_b + \frac{l_m}{2} - x\right) \tag{3}$$

and F is the force applied to a center of the proof mass 32, and I(x) is the moment of inertia given by $$I(x) = 2\left(\frac{wt_P^3}{12} + wt_P f_2^2(x)\right) + \frac{2nwf_1^3(x)}{3}. \tag{4}$$

Here, w is the width of the combined beam 14 and piezoelectric element 16, $$n = \frac{E}{E_S},$$

where E is the Young's modulus of the piezoelectric element 16 and $E_s$ is the Young's modulus of the cantilever beam 14. Referring to FIG. 3B, $$h \approx |f_2'(x)|\Delta x \text{ and } b = \Delta x\left(1 + \frac{M(x)f_2(x)}{EI(x)}\right) \quad (5)$$

Applying Equations (1)-(5), $$l^2 = \Delta x^2\left[\left(1 + \frac{M(x)f_2(x)}{EI(x)}\right)^2 + \left(\frac{df_2(x)}{dx}\right)^2 + \frac{M(x)}{EI(x)}\frac{df_2(x)}{dx}\Delta x\right] \quad (6)$$

which can be approximated by $$l^2 \approx \Delta x^2\left[\left(1 + \frac{M(x)f_2(x)}{EI(x)}\right)^2 + \left(\frac{df_2(x)}{dx}\right)^2\right] \quad (7)$$

Defining $l'_p$ as the length of the unbent curvature underneath the piezoelectric element 16 (see FIG. 3B), the average strain along the beam 14 is $$\varepsilon_{ave} = \frac{l - l'_p}{l'_p} \quad (8)$$

$$= \frac{1}{l'_p}\left[\int_0^{l_p} \sqrt{\left(1 + \frac{M(x)f_2(x)}{EI(x)}\right)^2 + \left(\frac{df_2(x)}{dx}\right)^2}\, dx - l'_p\right]$$

Also, the strain at each point along the beam 14 can be obtained as $$\varepsilon(x) = \frac{\sqrt{\left(1 + \frac{M(x)f_2(x)}{EI(x)}\right)^2 + \left(\frac{df_2(x)}{dx}\right)^2} - \sqrt{1 + \left(\frac{df_2(x)}{dx}\right)^2}}{\sqrt{1 + \left(\frac{df_2(x)}{dx}\right)^2}} \quad (9)$$

Applying standard mechanics, $$\varepsilon(x) = \frac{M(x)f_2(x)}{EI(x)},$$

one can obtain $$\varepsilon(x) = \sqrt{1 + \frac{\varepsilon^2(x) + 2\varepsilon(x)}{1 + \left(\frac{df_2(x)}{dx}\right)^2}} - 1 = \varepsilon_{CONST} \quad (10)$$

where $\varepsilon_{CONST}$ is the desired constant strain along the beam 14.

Defining $$\frac{\varepsilon^2(x) + 2\varepsilon(x)}{1 + \left(\frac{df_2(x)}{dx}\right)^2} = K_1$$

and after substituting for $\varepsilon(x)$, one can solve Equation (10) for $$\frac{df_2(x)}{dx} \quad (11)$$

as $$\frac{df_2(x)}{dx} = \sqrt{\frac{2EF(l_T - x)I(x)f_2(x) + F^2(l_T - x)^2 f_2^2(x)}{K_1 E^2 I^2(x)} - 1}$$

where $l_T = l_b + l_m/2$. Equation (11) can then be solved by applying numerical analysis.

Equation (11) provides how to shape the cantilever beam 14 in order to have a uniform strain distribution along the length of the beam 14. Thus, the cantilever beam 14 illustrated in FIGS. 3A and 3B is formed by applying Equation (11). As can be appreciated, the cantilever beam 14 may have varying dimensions as long as the dimensions satisfy Equation (11). For example, the first and second tapered surfaces 21,23 of the beam 14 illustrated in FIGS. 3A and 3B are not linear but rather slightly curved. Applicants have found that the slightly curved surfaces 21,23 are advantageous in that increased uniform strain distribution is obtained. However, other tapered surfaces could be used, as long as the beam dimensions satisfy Equation (11). Additionally, the first and second tapered surfaces 21,23 of the beam body 15 need not necessarily narrow to the narrowed end 19 at a point, as illustrated in FIG. 3A. Instead, the narrowed end could have a width, such that the first and second tapered surfaces 21,23 do not intersect.

Figure 5:
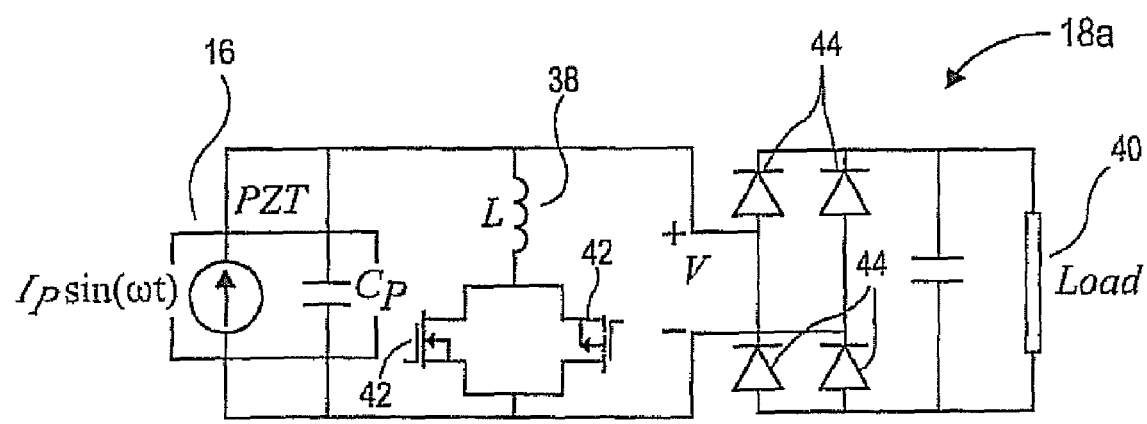
FIG. 5 is a schematic for a piezoelectric parallel voltage inversion circuit of embodiments of the present invention.

Upon application of strain to the piezoelectric element 16, the voltage produced by the element 16 is boosted by being inputted into the voltage inversion circuit 18. Voltage inversion circuits 18 of embodiments of the present invention are known in the art and are generally operable to invert the voltage from the element 16 through an inductor 38 each time the polarization current changes sign. An exemplary parallel circuit 18a is illustrated in the schematic of FIG. 5. In brief but described in more detail below, for the parallel circuit 18, the voltage waveform produced by the piezoelectric element 16 is forced to be in phase with the polarization current so that the power output is enhanced. This results in the DC voltage being increased, thus resulting in more energy harvested.

Figure 6:
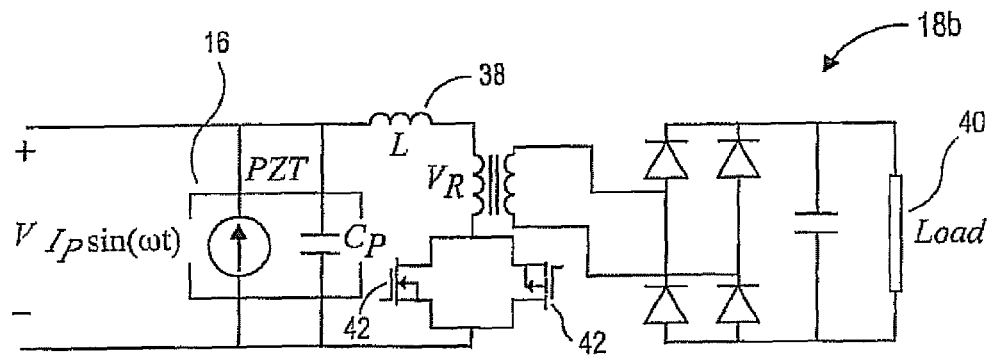
FIG. 6 is a schematic for a piezoelectric series voltage inversion circuit of embodiments of the present invention.

A series circuit 18b operates similarly to the parallel circuit 18a, except that a load 40 is connected in series with the inductor 38 and a plurality of switches so as to transfer the power during the switching time. An exemplary schematic of the series circuit is illustrated in FIG. 6. To further assist in producing as much power as possible, the voltage inversion circuit 18 utilizes electronic switching circuitry that consumes only 5% of the total harvested power.

In more detail, the voltage inversion circuit 18 boosts the power by first injecting current to the piezoelectric element 16, and in particular, the clamping capacitor 30. This injection of current can be performed in several stages or steps by use of transistors 44 that turn on and off for a very short period of time to transfer change from the voltage sources to the clamping capacitor 30, which consequently increases the voltage in the clamping capacitor 30. This increase in voltage is performed when the current source 28 of the piezoelectric element 16 has a zero current, which happens when the cantilever beam 14 is in an approximate middle position while vibrating, i.e., a non-flexed position. Upon movement of the beam 14 past the middle position, the charge transfer is stopped, and the current source 28 begins to undergo stress from the cantilever beam 14. This stress results in adding to the charge already stored in the capacitor 30. If the piezoelectric element 16 is connected to the load 40 at this time, then for a parallel voltage inversion, the latest charge to the capacitor 30 will be transferred to the load at a high voltage. Thus, the piezoelectric element 16 is producing a high power.

In a series inversion, illustrated in FIG. 6, the added charge can increase the voltage even further because the load 40 is not connected until the current from the current source 28 reverses, i.e., when the cantilever beam 14 passes the middle position. At this time, the load 40 is connected and receiving the energy from the piezoelectric element 16.

As noted above, the charge transfer during the voltage inversion step is provided by voltage sources and is controlled by transistors 44 that are turned on and off using a synchronized pulse. Applicants have shown that the produced energy after the voltage inversion circuit 18 is more than the energy needed for pre-charging the clamping capacitor 30. Thus, the overall energy of the system 10 is always positive. Nonetheless, the harvested power can be increased even further through the voltage compensating circuit 20.

In a second prong of the system 10 and method of embodiments of the present invention, the voltage compensating circuit 20 increases the harvested power by injecting current to the piezoelectric element 16 after each voltage inversion so as to increase the voltage level. The voltage compensating circuit 20 is, in embodiments of the present invention, at least a two-step circuit comprising a first step of synchronizing at least one voltage compensating switch 46 with the voltage inverting switches 42 by applying an adequate delay to end the inversion process and establish a new voltage in the original voltage inversion circuit 18, and a second step of consecutively closing the voltage compensating switches 46 to allow a transfer of energy, i.e., injecting current, to the piezoelectric element 16.

Figure 7:
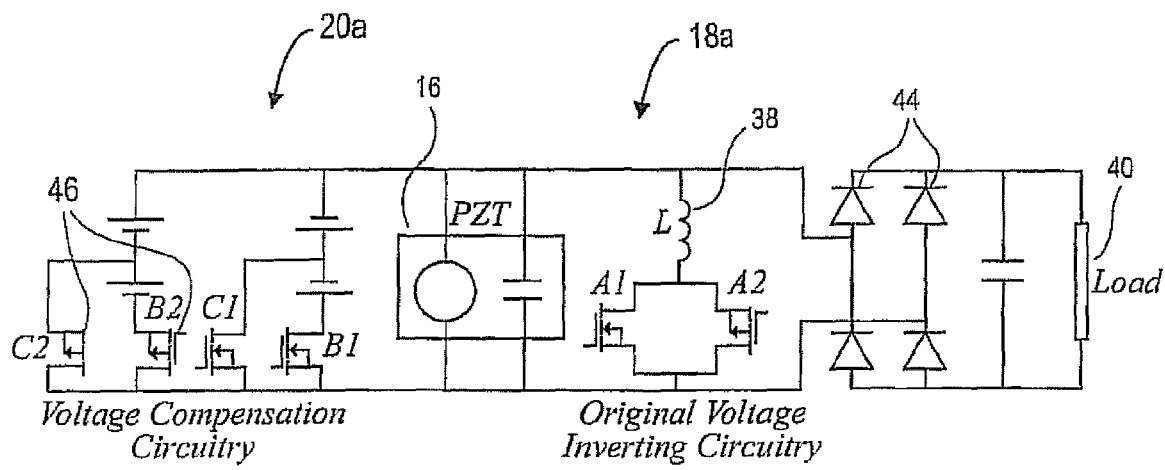
FIG. 7 is a schematic for a piezoelectric parallel voltage compensating circuit of embodiments of the present invention.
Figure 8:
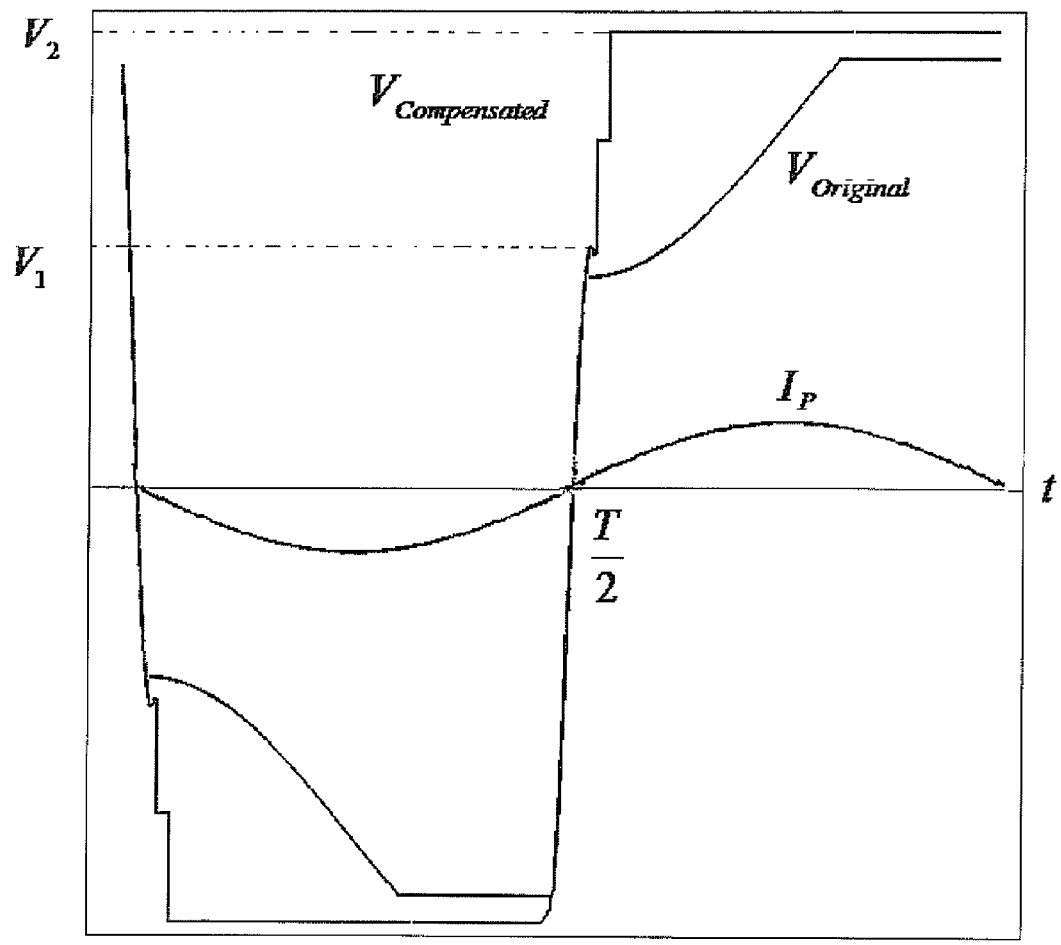
FIG. 8 is a graph providing a comparison of voltage waveforms for the prior art parallel voltage inversion circuit versus the parallel voltage compensating circuit of embodiments of the present invention.

In more detail, FIG. 7 illustrates the proposed two-step parallel voltage compensating circuit 20a in which compensating switches B1 and C1 are synchronized with inversion switch A1, and compensating switches B2 and C2 are synchronized with inversion switch A2. Increasing the number of steps or stages provides more output power, as will be described later. As noted above, the compensating switches 46 are synchronized with the original inverting switches A1,A2 by using an adequate delay in order to end the inversion process and establish the new voltage in the original voltage inversion circuit 18. The voltage compensating switches B1,C1,B2,C2 are then closed consecutively to allow the transfer of energy to the piezoelectric element 16, which compensates the voltage in each half cycle. Because it is always necessary to have a converter to deliver the power to the load 40, a multi-output converter (not shown) can be utilized to provide the compensation voltages as well as load voltage. A typical piezoelectric waveform, during voltage inversion and the compensating voltage phase, is illustrated in FIG. 8.

Using the above-described voltage compensations circuit 20, the injected current to the piezoelectric element 16, the dissipated energy during voltage compensation, and the total harvested energy under the new voltage level can be calculated by the following. Noting that the voltage inversion circuit is a half-cycle underdamped series RLC oscillation with a series voltage source, $$V_{Cmin} = V_L + \frac{(V_C(0) - V_L)}{\omega \sqrt{LC_P}} e^{-\sigma i} \sin(\overline{\omega} t + \theta) \quad (12)$$

where $\overline{\omega}t + \theta = \pi$, $\overline{\sigma}$ and $\overline{\omega}$ are the real and imaginary parts of RLC eigenvalues, and $V_L$ is the series DC voltage. Setting $V_L = 0$ for parallel inversion and designating $$\gamma = \left| \frac{V_{Cmin}}{V_C(0)} \right| = \left| \frac{V_1}{V_2} \right|,$$

where $V_2$ and $V_1$ are the voltages before and after the switching, respectively, the change in stored energy in the piezoelectric element 16 during voltage compensation is given by $$E_C = \frac{1}{2} C_p (V_2^2 - V_1^2) = \frac{1}{2} C_p V_2^2 (1 - \gamma^2). \quad (13)$$

This direct charging involves some energy dissipation, regardless of the amount of path resistance, which is given by $$E_{DISS} = \frac{1}{2\alpha} C_p (V_2 - V_1)^2 = \frac{1}{2\alpha} C_p V_2^2 (1 - \gamma)^2 \quad (14)$$

where the parameter $\alpha$ is the number of equally apart voltage steps from $V_1$ to $V_2$. The independency of dissipation from path resistance relaxes the need for high speed switching and allows simple switching techniques to be more useful. The harvested energy during a half-cycle at constant voltage $V_2$ is given by $$E_H = \int_0^{T/2} I_P \sin(\omega t) V_2 \, dt = \frac{2 I_P V_2}{\omega} \quad (15)$$

where $I_p \sin(\omega t)$ is the polarization current provided by piezoelectric element 16 in a sinusoidal mechanical motion. The net output energy, which is defined as the difference between the harvested and consumed energy becomes $$\Delta E = E_H - E_C - E_{DISS} \quad (16)$$
$$= \frac{2 I_P V_2}{\omega} - \frac{1}{2} C_p V_2^2 (1 - \gamma^2) - \frac{1}{2\alpha} C_p V_2^2 (1 - \gamma)^2$$

Combining the last two terms in Equation 16 yields $$\Delta E = \frac{2 I_P V_2}{\omega} - \frac{1}{2\alpha} C_P V_2^2 [1 + \alpha(1 - \gamma^2) + \gamma(\gamma - 2)] = \quad (17)$$
$$= \frac{2 I_P V_2}{\omega} - K C_P V_2^2$$

where $$K = \frac{1 + \alpha(1 - \gamma^2) + \gamma(\gamma - 2)}{2\alpha}$$

reflects the specifications of the voltage inverting and compensating circuitries 18,20. The maximum net energy $\Delta E_{OPT}$ will take place in the optimum output voltage $V_{2OPT}$ as presented $$\frac{d\Delta E}{dV_2} = 0 \Rightarrow V_{2OPT} = \frac{I_P}{K\omega C_P} \quad (18)$$

and $$\Delta E_{MAX} = \frac{I_P^2}{K\omega^2 C_P}.$$

This yields the maximum output power $$P_{MAX} = \frac{\Delta E_{MAX}}{T/2} = \frac{I_P^2}{K\pi\omega C_P}. \quad (19)$$

It can then be calculated that $$\alpha \to \infty \Rightarrow P_{MAX} \to \frac{2}{1+\gamma} P_{1MAX},$$

where $P_{1MAX}$ is the maximum power produced by the original parallel voltage inversion circuit 18a and is given as $$P_{1MAX} = \frac{I_P^2}{\pi C_P \omega (1-\gamma)}.$$

Thus, as γ approaches 1, the generated power in the voltage compensating circuit 20 approaches that of the parallel voltage inversion method. One important consequence of Equation (19) is that for a one-step voltage compensation (i.e. α=1), the maximum output power is equal to the maximum output power generated from the parallel voltage inversion circuit 18a. As a result, for the parallel voltage inversion circuit 18a, at least a two-step voltage compensation is preferred. Additional steps beyond a two-step compensation could also be used.

According to Equation (19), for α=2 and γ=0.5, which is practically feasible in high voltage applications, application of the voltage compensating circuits 20 provides an increase of approximately 15% over the prior art parallel voltage inversion circuit 18a. Thus, application of the voltage compensating circuit 20 of embodiments of the present invention results in a sizable increase in harvested power. In embodiments of the present invention where both the voltage compensating circuit 20 and the tapered cantilever beam 14 are used, the harvested power is increased even further.

Figure 9:
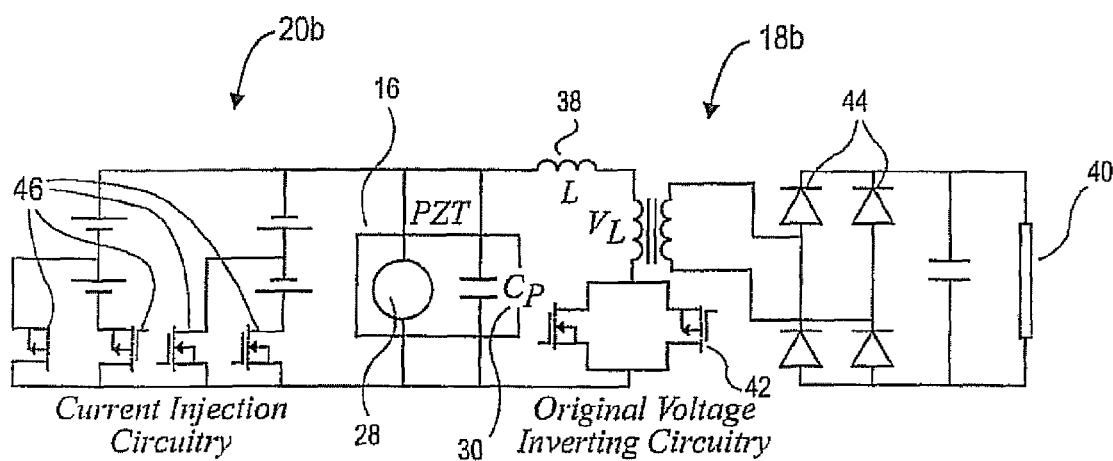
FIG. 9 is a schematic for a piezoelectric series voltage compensating circuit of embodiments of the present invention.

A series voltage compensating circuit 20b is illustrated in FIG. 9, along with the prior art series voltage inversion circuit 18b. Unlike the parallel circuit, the series voltage compensating circuit 20b can be used to obtain advantageous results with just a one-step compensation. However, a multiple-step compensation, as with the parallel circuit, could also be used.

Figure 10:
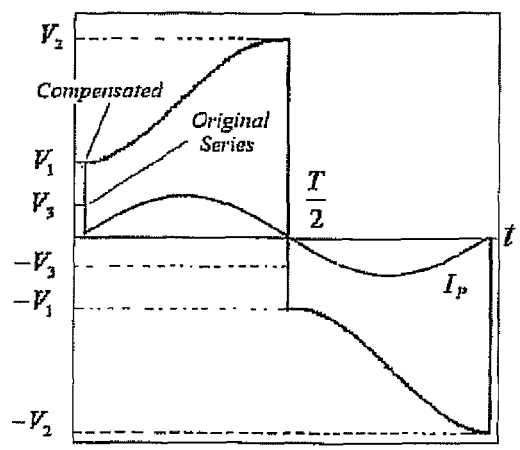
FIG. 10 is a graph providing a comparison of voltage waveforms for the prior art series voltage inversion circuit versus the series voltage compensating circuit of embodiments of the present invention.

Referring to the graph of the series waveforms in FIG. 10, in a series circuit the voltage starts to decrease from $V_2$ to $-V_3$ as a result of the voltage inversion and during the transfer of energy to the load 40. At the end of the voltage inversion, current is injected into the piezoelectric clamping capacitor 30, which increases the voltage to $|-V_1|$. All of the switches A1,B1,C1,A2,B2,C2 are then opened, and the piezoelectric polarization current source 28 begins transferring charge to the clamping capacitor 30. Following the same steps as for the parallel voltage inversion circuit 18a, the given energy to the piezoelectric clamping capacitor 30, the dissipated energy during current injection, and the total harvested energy according to the new voltage level can be calculated. The change in the stored energy in the piezoelectric element 16 and the dissipated energy during current injection in each half cycle are given by $$E_C = \frac{1}{2} C_P (V_1^2 - V_3^2) \quad (20)$$

$$E_{DISS} = \frac{1}{2\alpha} C_P (V_1 - V_3)^2$$

where the parameter α is the number of equally apart voltage steps from $V_1$ to $V_3$. The new harvested energy during the same half cycle will be $$E_H = QV_L = C_P(V_2 + V_3)V_L \quad (21)$$

where $V_L$ is the DC voltage across the load. Recalling $-V_3V_L + (-V_2 + V_L)\gamma$, where $$\gamma = \left|\frac{V_3 + V_L}{V_2 - V_L}\right|$$

and $$V_2 = V_1 + \frac{2I_P}{C_P\omega}$$

from the piezoelectric model, the voltage prior to compensation is $$V_3 = -V_L(1+\gamma) + V_1\gamma + \frac{2I_P\gamma}{C_P\omega}. \quad (22)$$

Plugging Equation (22) into Equations (20) and (21) gives the net output energy in a half-cycle for series voltage compensation as $$\Delta E = E_H - E_C - E_{Diss} = C_P(1+\gamma)\left[V_1 + \frac{2I_P}{C_P\omega} - V_L\right]V_L - \quad (23)$$

$$\frac{C_P}{2\alpha}\left((\alpha+1)V_1^2 - (\alpha-1)\left[-V_L(1+\gamma) + V_1\gamma + \frac{2I_P\gamma}{C_P\omega}\right]^2 - 2V_1\left[-V_L(1+\gamma) + V_1\gamma + \frac{2I_P\gamma}{C_P\omega}\right]\right)$$

The optimization of ΔE with respect to $V_1$ and $V_R$ results in solving $$\frac{\partial \Delta E}{\partial V_1} = 0$$

and $$\frac{\partial \Delta E}{\partial V_L} = 0$$

which in turn yields the set of equations $$b_1 V_L + b_2 V_1 = a_1$$

$$b_2 V_L + b_3 V_1 = a_2 \quad (24)$$

where the parameters are $$b_1 = -\left(2C_P(1+\gamma) - \frac{C_P}{\alpha}(\alpha-1)(1+\gamma)^2\right) \quad (25)$$

$$b_2 = C_P(1+\gamma) - \frac{C_P}{\alpha}(\alpha-1)(1+\gamma)\gamma - \frac{C_P}{\alpha}(1+\gamma)$$

$$b_3 = -\left(\frac{C_P}{\alpha}(\alpha+1-2\gamma) - \frac{C_P}{\alpha}(\alpha-1)\gamma^2\right)$$

$$a_1 = -\left(\frac{2(1+\gamma)I_P}{\omega} - \frac{2}{\alpha\omega}(\alpha-1)(1+\gamma)\gamma I_P\right)$$

$$a_2 = -\left(\frac{2}{\alpha\omega}(\alpha-1)\gamma^2 I_P + \frac{2}{\alpha\omega}\gamma I_P\right)$$

As $\alpha$ approaches infinity, and in the case that $V_3 = -V_1$, Equations (20) are relaxed and with $$V_L = \frac{V_1}{2} + \frac{I_P}{C_P\omega}$$

as optimal load voltage, the maximum net output power becomes $$P_{MAX} = \frac{I_P^2(1+\gamma)}{\pi C_P\omega} + \frac{\omega C_P(1+\gamma)}{4\pi}V_1^2 + \frac{(1+\gamma)}{\pi}I_P V_1 \quad (26)$$

Equation (26) reveals that the net output power in the series inversion method can be arbitrarily high regardless of $\gamma$ as long as the number of compensation steps, if practical, is large enough.

The relationship between the optimal voltages and maximum power for a one-step voltage compensation in a series circuit will be simplified as $$\frac{d\Delta E}{dV_1} = 0 \Rightarrow V_{1OPT} = \frac{I_P\gamma}{C_P(1-\gamma)\omega}, \quad (27)$$

$$\frac{d\Delta E}{dV_R} = 0 \Rightarrow V_{R\_OPT} = \frac{I_P}{C_P\omega},$$

and $$\Delta E_{MAX} = \frac{I_P^2\gamma^2}{C_P(1-\gamma)\omega^2} + \frac{I_P^2(1+\gamma)}{C_P\omega^2}$$

and the net output power will be given by $$P_{MAX} = \frac{\Delta E_{MAX}}{T/2} = \frac{I_P^2}{\pi C_P(1-\gamma)\omega}. \quad (28)$$

It can be seen that the maximum power using a one-step voltage compensation is equal to $$P_{MAX} = \frac{2}{1+\gamma}P_{2MAX},$$

where $P_{2MAX}$ is the maximum power produced by the original series voltage inversion method given by $$P_{2MAX} = \frac{I_P^2(1+\gamma)}{2\pi C_P\omega(1-\gamma)}.$$

Increasing the number of compensation steps will further increase $P_{MAX}$.

EXAMPLES

Figure 12:
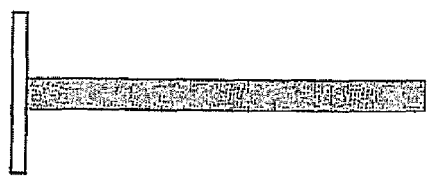
FIG. 12 is a vertical cross-section of the rectangular-shaped cantilever beam of embodiments of the present invention.

Applicants performed a series of experiments to test the tapered cantilever beam 14 design and the voltage compensating circuit 20 of embodiments of the present invention. The experimental setup comprised two 15 cm steel cantilever beams: a first, prior art rectangular-shaped beam 48 illustrated in FIG. 12, and a second, tapered beam 14 of embodiments of the present invention. Both beams 14,48 were fixed on a shaker (i.e., the vibration-producing device 12). The beams 14,48 were monitored at thirty-two equally spaced points along the beam, beginning with $f_1(x)=2$ mm at the fixed end using Equation (11). The piezoelectric elements 16 used were thin, flexible strips of composite fibers with laminate coating that were glued on the beams using epoxy. The material specifications for the piezoelectric element 16 are shown in the below Table 1:

TABLE 1

Piezoelectric Element Specifications
(Advanced Cerametrics Inc.)

| Specifications | Values |
|---|---|
| Fiber Type | PZT_5A |
| Dimensions | 13.0 cm × 1.0 cm × 0.4 cm |
| Avg. Actual Strain @ 3KVpp under 600 Vdc bias (ppm) | 1800 |
| Operational Voltage Limits | −1500 to 2800 |
| Weight | 1.8 grams |
| Dielectric Constant at 1 kHz | 1725 |
| $K_{33}$ | 72% |
| $D_{33}$ | 380 (10e−12 m/V) |
| Young's Modulus | $6.6 \times 10^{10}$ N/m$^2$ |

Four piezoelectric strips were coupled with the rectangular-shaped cantilever beam 48, and two piezoelectric strips were coupled with the tapered beam 14. The piezoelectric strips used on the tapered beam 14 were twice the volume of the strips used on the rectangular-shaped beam 48 so that the total volume of piezoelectric material on the two beams 14,48 was the same. A proof mass 32 of 170 grams was attached to each of the beams to produce the desired force on the beams.

Figure 11:
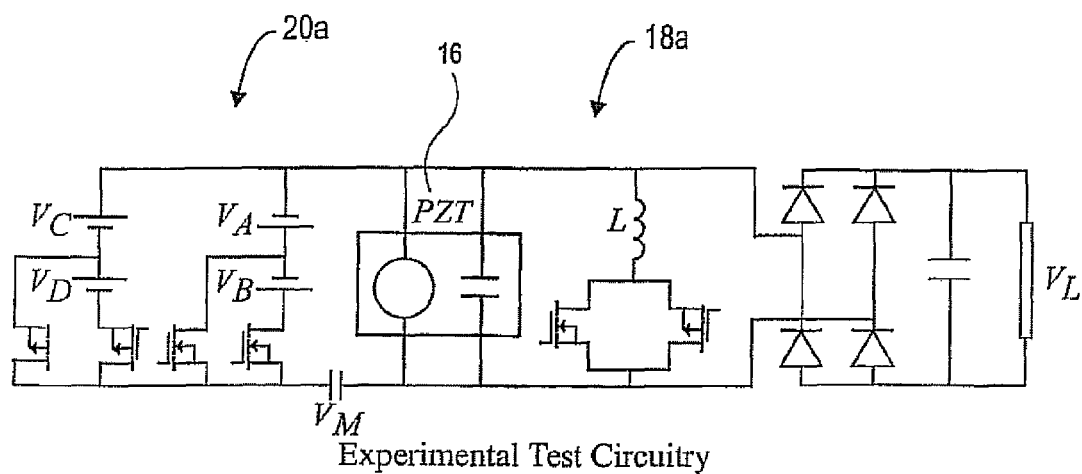
FIG. 11 is a schematic for a piezoelectric parallel voltage compensation circuit.

To run the test for the parallel compensating circuit 20a, the circuit illustrated in FIG. 11 was used. For the series inversion circuit 18b where the load 40 is in series with the inductor 38, the circuitry illustrated in FIG. 11 was slightly modified. A two-step compensation method was applied for both parallel and series compensating circuits 20a,20b. Instead of using voltage sources $V_A$, $V_B$, $V_C$, and $V_D$, the outputs of an adjustable flyback power converter (not shown) were used so that the compensated voltage could be adjusted.

The test frequency and cantilever beam's free end vibration amplitude was set at 40 Hz and 4 mm, respectively, for the rectangular-shaped beam 48, and 47 Hz and 2.5 mm, respectively, for the tapered beam 14. The internal capacitance of the piezoelectric elements was measured using a conventional multimeter, and it was found to be 2.8 nF for the single layer piezoelectric elements on the rectangular-shaped beam 48, and 5.6 nF for the double layer piezoelectric elements on the tapered beam 14. When the piezoelectric element's leads were connected to the circuitry, the total capacitance measured from the piezoelectric element's terminals was not constant and appeared to be higher than the original values due to capacitive effects of MOSFETs and measuring devices.

The polarization current $I_p$ was calculated using the equation $$V_P = \frac{I_P}{C_P \omega}$$

where $V_P$ is the open circuit peak voltage. The parameter γ was measured using voltage before and after inversion using an oscilloscope and was not a constant. The measured values are provided in Tables 2 and 3, below.

TABLE 2

Test Specifications for the Rectangular-Shaped Cantilever Beam

| | Parallel Voltage Compensation | Series Voltage Compensation |
|---|---|---|
| Frequency | 40 Hz | 40 Hz |
| Beam's free end vibration amplitude | 4 mm | 4 mm |
| $I_P$ | 76 μA | 76 μA |
| $C_P$ | 2.8 nF | 2.8 nF |
| γ | <0.5 | <0.5 |

TABLE 3

Test Specifications for the Tapered Cantilever Beam

| | Parallel Voltage Compensation | Series Voltage Compensation |
|---|---|---|
| Frequency | 47 Hz | 47 Hz |
| Beam's free end vibration amplitude | 2.5 mm | 2.5 mm |
| $I_P$ | 170 μA | 170 μA |
| $C_P$ | 5.6 nF | 5.6 nF |
| γ | <0.3 | <0.3 |

In the parallel circuit illustrated in FIG. 11, the voltage values $V_A+V_B$ and $V_C+V_D$ were kept slightly less than $V_L$ to avoid direct charging of the capacitor 30 using the adjustable flyback power converter as described above. The transferred charge from the compensating power supplies to the piezoelectric element 16 during each half-cycle was measured using the change in voltage $V_M$ at each compensation step. Similarly, the compensating voltages $V_A$, $V_B$, $V_C$, and $V_D$ were measured using conventional multimeters, and with the transferred charge, were used to calculate the amount of injected power. The net output power is defined as the difference between load power and injected power.

Figure 13:
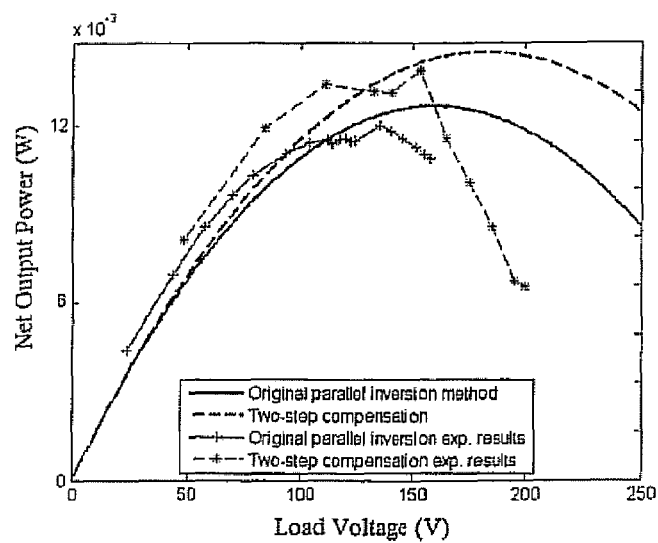
FIG. 13 is a graph comparing the parallel voltage inversion circuit of the prior art when used alone versus when used with the two-step parallel voltage compensating circuit of embodiments of the present invention when using the prior art rectangular-shaped cantilever beam and further illustrating both theoretical and experimental results.
Figure 14:
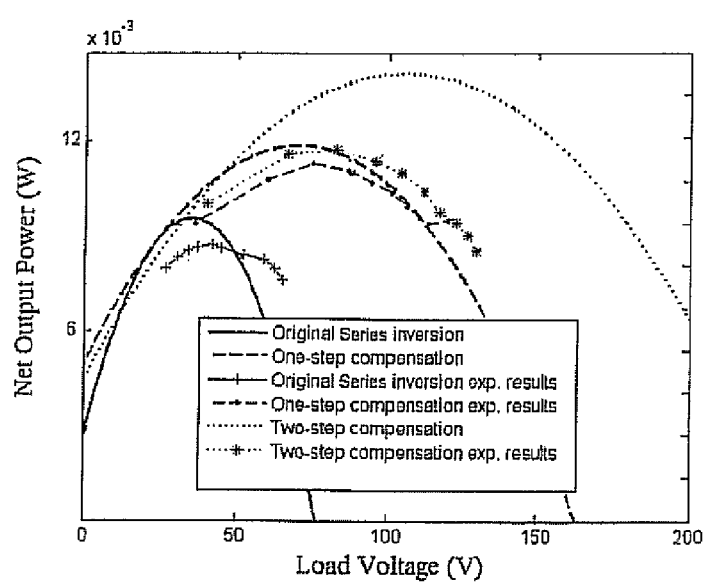
FIG. 14 is a graph comparing the series voltage inversion circuit of the prior art when used alone versus when used with both a one-step and a two-step series voltage compensating circuit of embodiments of the present invention when using the prior art rectangular-shaped cantilever beam and further illustrating both theoretical and experimental results.

For the rectangular-shaped cantilever beam 48, the experimental results versus the theoretical values for voltage compensation in parallel and series inversion methods are shown in the graphs of FIGS. 13 and 14, respectively. Comparing the experimental values with the theoretical values for each of the parallel and series circuits, the experimental results match the theoretical results with an acceptable accuracy both at the low and near the optimum voltages. However, at high voltages the results diverge due to the off-state of the solid-state switches and input resistances of the measuring devices. As can be seen, when using the prior art rectangular-shaped beam 48, the voltage compensating circuit 20 of embodiments of the present invention provides an approximately 15% increase in the harvested power in parallel voltage inversion and an approximately 50% increase in series voltage inversion.

Figure 15:
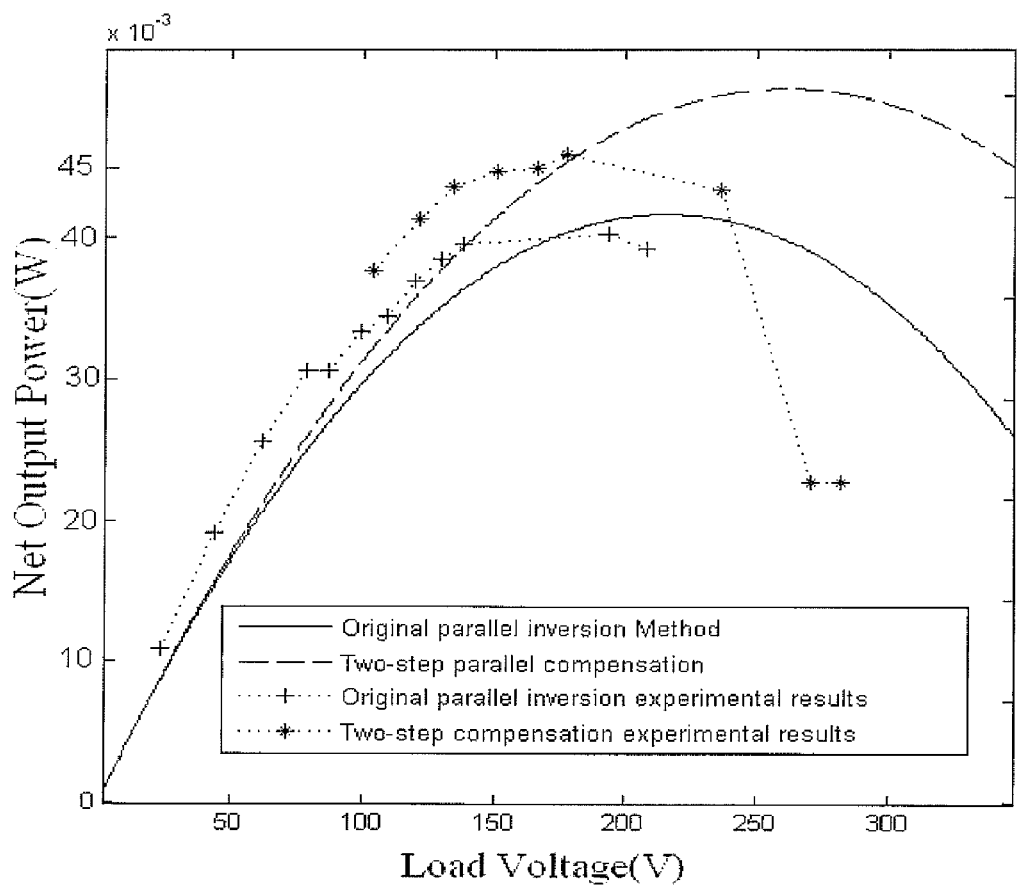
FIG. 15 is a graph comparing the parallel voltage inversion circuit of the prior art when used alone versus when used with the two-step parallel voltage compensating circuit of embodiments of the present invention when using the tapered cantilever beam of embodiments of the present invention and further illustrating both theoretical and experimental results.

For the tapered beam 14 of embodiments of the present invention, the improvement between the theoretical and experimental results is even greater. Referring to FIGS. 15 and 16, the voltage compensation circuit of embodiments of the present invention provides an approximately 15% increase in the harvested power in parallel voltage inversion (see FIG. 15) and an approximately 75% increase in series voltage inversion (see FIG. 16).

The power harvesting summary from Applicants' experiments appears in Table 4, below. The experimental results were obtained using the voltage compensating circuit 20 of embodiments of the present invention, in addition to the prior art parallel voltage inversion circuit 18 for boosting power. The parallel voltage inversion circuit 18a was chosen due to its higher power productivity than series voltage inversion 18b. According to the test results, the tapered cantilever beam 14 of embodiments of the present invention is able to increase the scavenged power by a factor of 3.3. By also using the voltage compensating circuit 20, the power is further increased by approximately 15% in a parallel circuit. The total obtained amount using both the tapered cantilever beam 14 and the voltage compensating circuit 20 is approximately 46 mW, which is approximately ten times greater power than presently-available energy harvesting devices.

TABLE 4

Power Comparison of Different Methods

| Method | Harvested Power Theoretical Results | Harvested Power Exp. Results |
|---|---|---|
| Rectangular Beam + Power Boosting | 12 mW | 12 mW |
| Tapered Beam + Power Boosting | 56 mw | 40 mW |
| Tapered Beam + Power Boosting + Voltage Compensation | 65 mW | 46 mW |

To evaluate the power harvesting effect of the system 10 of embodiments of the present invention in a realistic scenario, Applicants arranged a field setup that included the tapered cantilever beam 14 accompanied by the parallel inversion circuit 18a and the voltage compensating circuit 20a. The setup was housed within an enclosure mounted on a bulldozer 12 assumed to have adequate levels of vibration while moving in a farm. The data representing the harvested energy was received by a receiver coupled with a computer. The data was plotted versus time, as shown in the graph of FIG. 17. According to FIG. 17, an average harvested power of 5 mW was achieved from the moving bulldozer 12 on an uneven rural field. The scavenged power from the mobile, field application is less than the power obtained in the laboratory tests, likely because in a mobile application, different frequencies are normally observed, whereas in a laboratory test, the energy harvested works in a single frequency. To increase the harvested power in mobile applications, multiple cantilever beams could be installed that resonate at various frequencies. Additionally, circuitry could be used to activate the voltage inversion circuit's MOSFETs in low level vibrations. In contrast, the tested circuitry was activated only when the produced voltage was high enough, and consequently, the system was not continually active, thereby delivering less power. Even in view of the above, the system 10 produces an increase in the energy harvested over prior art systems, even in realistic use scenarios.

As discussed above and as can be appreciated, the system of embodiments of the present invention may utilize one or both of the voltage compensating circuit 20 and tapered cantilever beam 14 described herein. Thus, for example, one embodiment of the present invention may only employ the voltage compensating circuit 20, whereas another embodiment of the present invention may only employ the tapered cantilever beam 14. A third embodiment may employ both the voltage compensating circuit 20 and the cantilever beam 14. Therefore, the description of the embodiments of the present invention herein is not intended to be limiting to any combination of the described circuits and cantilever beam.

Although embodiments of the invention have been described herein, it is noted that equivalents and substitutions may be employed without departing from the scope of the invention as recited in the claims. For example, instead of coupling thin strips of flexible piezoelectric element to the cantilever beam, the entire beam could be formed of a piezoelectric element.

Having thus described the embodiments of the invention, what is claimed as new and desired to be protected by Letters Patent includes the following:

We claim:

1. A system for harvesting energy from vibrations, the system comprising:
    a vibration-producing device operable to produce vibrations;
    a tapered cantilever beam associated with the vibration-producing device and configured to receive the vibrations;
    a piezoelectric element coupled with the cantilever beam and operable to receive a strain from the vibrations so as to induce a voltage across the element;
    a voltage inversion circuit coupled with the piezoelectric element and operable to invert the voltage so as to boost a power output; and
    a voltage compensating circuit operable to further increase the power output by injecting current to the piezoelectric element after each voltage inversion performed by the voltage inversion circuit.

2. The system of claim 1, wherein the tapered cantilever beam is tapered according to the following equation:

$$\frac{df_2(x)}{dx} = \sqrt{\frac{2EF(l_T - x)I(x)f_2(x) + F^2(l_T - x)^2 f_2^2(x)}{K_1 E^2 I^2(x)}} - 1 .$$

where:
E is an electrical field,
F is a force applied to a center of a proof mass,
I(x) is the moment of inertia,
$l_T = l_b + l_m/2$, and $l_b$ is the length of the beam and $l_m$ is the length of the proof mass,
$f_2(x) = f_1(x) + t_b/2$, where the function $f_1(x)$ is the distance between a surface of the cantilever beam surface and a center of the beam, and $t_b$ is the piezoelectric element's thickness, and $$K_1 = \frac{\varepsilon^2(x) + 2\varepsilon(x)}{1 + \left(\frac{df_2(x)}{dx}\right)^2}, \text{ and } \varepsilon(x) = \frac{M(x)f_2(x)}{EI(x)}, \text{ and}$$

$$M(x) = \frac{F}{EI(x)}\left(l_h + \frac{l_m}{2} - x\right).$$

3. The system of claim 1, wherein the cantilever beam has a body including—
    a first tapered surface,
    a second tapered surface,
    a fixed end configured to be associated with the vibration-producing device, and
    a narrowed end opposite and narrower than the fixed end.

4. The system of claim 3, wherein the piezoelectric element is at least one flexible strip at least partially coupled to at least one of the first and second tapered surfaces of the beam's body.

5. The system of claim 1, wherein the piezoelectric element comprises a current source and a clamping capacitor, and the voltage inversion circuit boosts the power by injecting current to the clamping capacitor.

6. The system of claim 1, wherein the voltage inversion circuit comprises at least one inductor, a plurality of voltage inverting switches, at least one transistor, and a load.

7. The system of claim 6, wherein the voltage compensating circuit comprises a plurality of voltage compensating switches.

8. The system of claim 6, wherein the voltage compensating circuit is at least a two-step circuit including—
    a first step of synchronizing at least one voltage compensating switch with at least one voltage inverting switch by applying a delay to end the inversion of the voltage and establish a new voltage in the voltage inversion circuit, and
    a second step of consecutively closing the plurality of voltage compensating switches to allow the injection of current to the piezoelectric element.

9. A system for harvesting energy from vibrations, the system comprising:
    a vibration-producing device operable to produce vibrations;
    a piezoelectric element associated with the vibration-producing device and operable to receive a strain from the vibrations so as to induce a voltage across the element;
    a voltage inversion circuit coupled with the piezoelectric element and operable to invert the voltage so as to boost a power output; and
    a voltage compensating circuit operable to further increase the power output by injecting current to the piezoelectric element after each voltage inversion performed by the voltage inversion circuit.

10. The system of claim 9, further comprising a tapered cantilever beam coupled with the vibration-producing device and the piezoelectric element.

11. The system of claim 10, wherein the tapered cantilever beam is tapered according to the following equation:

$$\frac{df_2(x)}{dx} = \sqrt{\frac{2EF(l_T - x)I(x)f_2(x) + F^2(l_T - x)^2 f_2^2(x)}{K_1 E^2 I^2(x)}} - 1 .$$

where:
E is an electrical field,
F is a force applied to a center of a proof mass,
I(x) is the moment of inertia,
$l_T = l_b + l_m/2$, and $l_b$ is the length of the beam and $l_m$ is the length of the proof mass,
$f_2(x) = (x) + t_b/2$, where the function $f_1(x)$ is the distance between a surface of the cantilever beam surface and a center of the beam, and $t_b$ is the piezoelectric element's thickness, and $$K_1 = \frac{\varepsilon^2(x) + 2\varepsilon(x)}{1 + \left(\frac{df_2(x)}{dx}\right)^2}, \text{ and } \varepsilon(x) = \frac{M(x)f_2(x)}{EI(x)}, \text{ and}$$

$$M(x) = \frac{F}{EI(x)}\left(l_h + \frac{l_m}{2} - x\right).$$

12. The system of claim 9, wherein the voltage inversion circuit comprises at least one inductor, a plurality of voltage inverting switches, at least one transistor, and a load.

13. The system of claim 12, wherein the voltage compensating circuit comprises a plurality of voltage compensating switches.

14. The system of claim 13, wherein the voltage compensating circuit is at least a two-step circuit including—
 a first step of synchronizing at least one voltage compensating switch with at least one voltage inverting switch by applying a delay to end the inversion of the voltage and establish a new voltage in the voltage inversion circuit, and
 a second step of consecutively closing the plurality of voltage compensating switches to allow the injection of current to the piezoelectric element.

* * * * *